(12) United States Patent
Marmonier

(10) Patent No.: US 6,581,462 B2
(45) Date of Patent: *Jun. 24, 2003

(54) METHOD AND A DEVICE FOR DETECTING AN INTERNAL ARC IN A METAL-CLAD ELECTRICAL LINK

(75) Inventor: Jean Marmonier, Aix Les Bains (FR)

(73) Assignee: Alstom Holdings, Paris (FR)

( * ) Notice: Subject to any disclaimer, the term of this patent is extended or adjusted under 35 U.S.C. 154(b) by 0 days.

This patent is subject to a terminal disclaimer.

(21) Appl. No.: 10/185,065

(22) Filed: Jul. 1, 2002

(65) Prior Publication Data

US 2002/0166397 A1 Nov. 14, 2002

Related U.S. Application Data

(63) Continuation of application No. 09/447,058, filed on Nov. 23, 1999, now Pat. No. 6,481,280.

(30) Foreign Application Priority Data

Nov. 25, 1998 (FR) .............................. 98 14819

(51) Int. Cl.$^7$ .............................................. G01R 31/08
(52) U.S. Cl. ...................................... 73/432.1
(58) Field of Search .............................. 73/865.8, 432.1

(56) References Cited

U.S. PATENT DOCUMENTS

| | | | |
|---|---|---|---|
| H536 H | 10/1988 | Strickland et al. | |
| 4,790,190 A | 12/1988 | Bambara et al. | |
| 4,957,007 A | 9/1990 | Gray | |
| 5,446,788 A | 8/1995 | Lucey et al. | |
| 5,910,872 A | 6/1999 | Marmonier et al. | |
| 6,481,280 B1 * | 11/2002 | Marmonier | 73/432.1 |

FOREIGN PATENT DOCUMENTS

| | | |
|---|---|---|
| FR | 2 402 877 | 4/1979 |
| JP | 63 210 676 | 9/1988 |
| WO | WO 97/10515 | 3/1997 |

* cited by examiner

*Primary Examiner*—Robert Raevis
(74) *Attorney, Agent, or Firm*—Sughrue Mion, PLLC

(57) ABSTRACT

The invention relates to a method of detecting an internal arc in a metal-clad electrical link, wherein the rising edge of the internal pressure surge generated by the arc and propagating inside the cladding is detected at a fixed location along the cladding. The invention also relates to a device comprising at least one one-way detection unit constituted by a pressure sensor disposed outside the cladding and connected to the inside the cladding via a horn-shaped duct which slopes relative to the axis of the cladding, which has its mouth opening out in the cladding, and which has its tip connected to the pressure sensor.

3 Claims, 5 Drawing Sheets

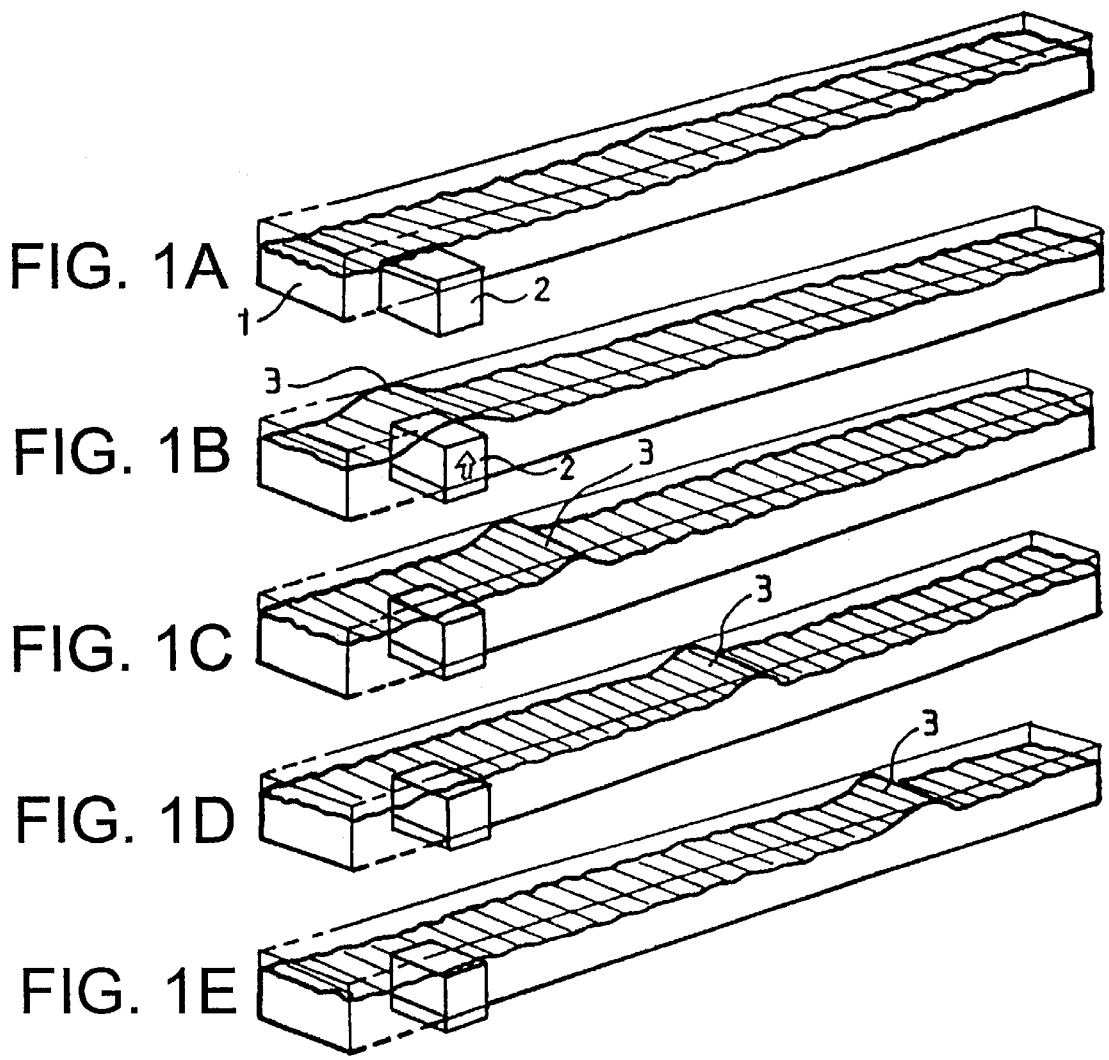
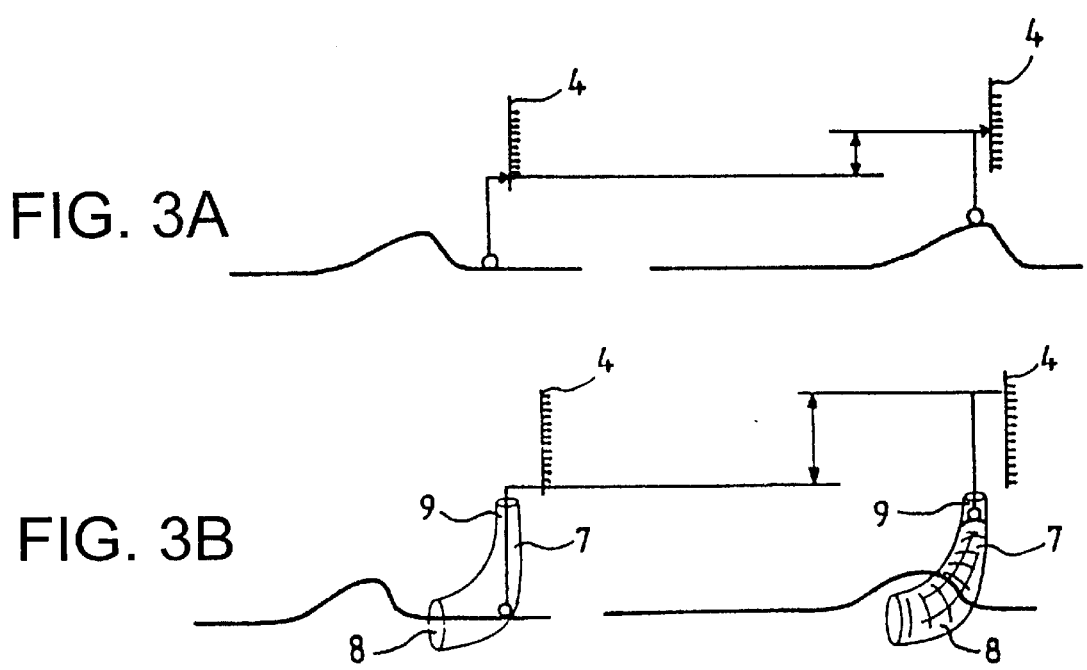

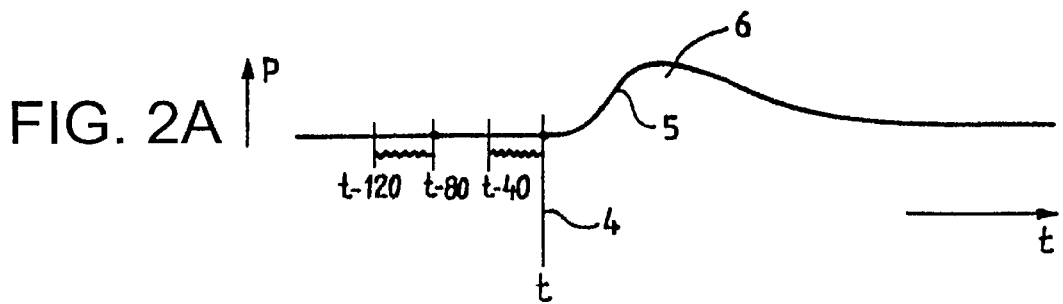
FIG. 2A
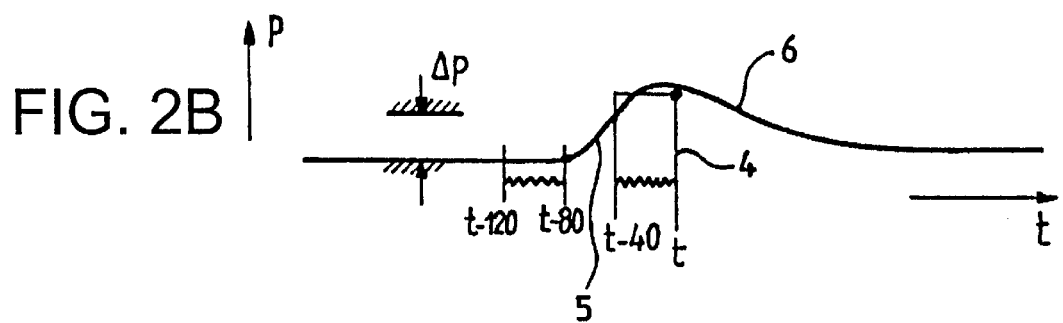
FIG. 2B
FIG. 4
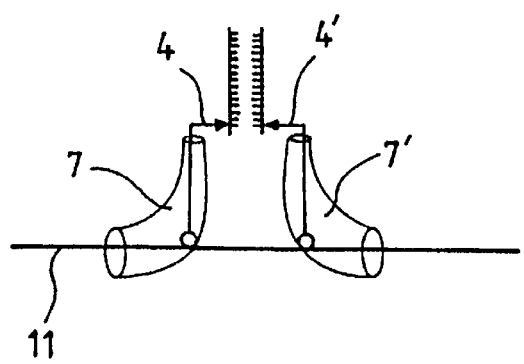

METHOD AND A DEVICE FOR DETECTING AN INTERNAL ARC IN A METAL-CLAD ELECTRICAL LINK

This is a continuation of application Ser. No. 09/447,058 filed Nov. 23, 1999, now U.S. Pat. No. 6,481,280, which is hereby incorporated by reference.

The present invention relates to a method and a device serving to detect an internal arc in a metal-clad electrical link, in particular for links that are long, e.g. 100 meters (m) in length.

BACKGROUND OF THE INVENTION

When a short-circuit current occurs in a metal-clad electrical link, an increase in the pressure inside the cladding is generated at the fault, and that pressure increase results in two pressure surges being generated, each of which propagates in a respective direction away from the place where the short-circuit current has occurred. By detecting the pressure surge, it is possible to observe the appearance of a fault in the line. It is particularly advantageous to locate the place at which the fault occurs so as to detect faults that are repetitive.

Currently, the pressure surge generated by the short-circuit current is detected by measuring the increase in the mean pressure by means of a pressure sensor. For this purpose, it possible to use density transmitters that serve to monitor the density of the gas inside the cladding segment in question, each such density transmitter being constituted by a pressure sensor whose measurement is compensated as a function of temperature so as to obtain the density of the gas.

The pressure surge that is generated is relatively small, e.g. about 10%, and the pressure surge that propagates inside the cladding from the fault point is attenuated as it propagates and its value decreases going away from the fault point. As a result, the sensitivity of those detectors is low, and it is not always possible to detect faults that occur in segments of long length.

The problem addressed by the invention is to improve detection sensitivity and to determine the position of the short-circuit arc relative to the detector.

OBJECTS AND SUMMARY OF THE INVENTION

In the present invention, the rising edge of the internal pressure surge generated by the arc and propagating inside the cladding is detected at a fixed location along the cladding.

It is easier to detect the passage of the rising edge of a pressure surge because its amplitude is greater than the mean pressure variation, and this significantly increases the sensitivity of the sensor.

According to another characteristic of the invention, the pressure inside the cladding is measured continuously for two equal durations shorter than the time taken by the rising edge to go past, and separated by a time interval shorter than the time taken by the rising edge to go past, the curve of the measurements taken during each of said durations is integrated, the difference between the two integration values is determined, and the pressure difference obtained is compared with a threshold value.

The pressure of the dielectric gas is monitored continuously, and this algorithm makes it possible to measure two values of the pressure at two close-together instants, and the resulting value is independent of the steady pressure value which can itself be subject to fluctuations. As a result, accuracy is significantly improved, and therefore so is the sensitivity with which the passing pressure surge is detected.

Advantageously, the measurement durations are substantially equal to one half of the time taken by the rising edge to go past, and the time interval is substantially equal to one half of the time taken for the rising edge to go past. These times depend on the propagation speed of pressure waves in the dielectric gas.

This makes it possible to compare pressure values during two durations corresponding respectively substantially to the beginning of the rising edge and to the end thereof so that the difference between the integrated values in maximized.

According to another characteristic of the invention, the detection is performed substantially in the middle of the cladding segment to be monitored.

In this way, sensitivity is further improved because the attenuation of the pressure surge as it propagates is limited to the attenuation corresponding to one halt of the length of the segment to be monitored.

The invention also provides a device for implementing the above-mentioned method, the device comprising at least one one-way detection unit constituted by a pressure sensor disposed outside the cladding and connected to the inside the cladding via a horn-shaped duct which slopes relative to the axis of the cladding, which has its mouth opening out in the cladding, and which has its tip connected to the pressure sensor.

The resulting interface between the segment to be monitored and the sensor makes it possible firstly to improve sensitivity because of the additional surge pressure generated by the duct which constitutes a sort of funnel. Furthermore, the resulting detection unit acts in one-way manner and is sensitive only to the pressure surges coming from the direction opposite to the direction in which the duct slopes.

Advantageously, there is provided a set of at least two one-way detection units having the same detection direction and disposed in the vicinity of each other, and whose ducts slope the same way.

This configuration makes it possible to obtain redundancy in terms of fault location by mitigating sensor failure.

It is possible to provide two one-way detection sets whose ducts slope in mutually opposite directions and which are disposed in the vicinity of each other.

In this way, by using four detection units, it is possible to detect and to locate, with good sensitivity and high reliability, faults that occur on either side of the detection sets.

In an embodiment of the invention, use is made of two pressure sensors connected in parallel to two ducts which slope in mutually opposite directions and whose tips communicate with each other.

This configuration makes it possible to form a both-way detector device of high sensitivity and having detection redundancy because the sensors are duplicated.

In another embodiment of the invention, use is made of two directional detection units whose ducts slope in mutually opposite directions A both-way detection device is thus obtained that makes it possible to locate the faults but that has no back up against sensor failure.

Advantageously, for these two embodiments, use is made of the two sensors serving to monitor the density of the dielectric gas. This makes it possible to form a detection device at little extra cost.

BRIEF DESCRIPTION OF THE DRAWINGS

Other characteristics and advantages of the invention appear from the following description given by way of non-limiting example, with reference to the accompanying drawings, in which:

FIG. 1 is a hydraulic analogy explaining the phenomenon of the pressure wave;

FIG. 2 describes the algorithm used;

FIG. 3 shows the amplification obtained by the interface duct;

FIG. 4 shows a both-way detection device using the hydraulic analogy;

MORE DETAILED DESCRIPTION

Figure 5:
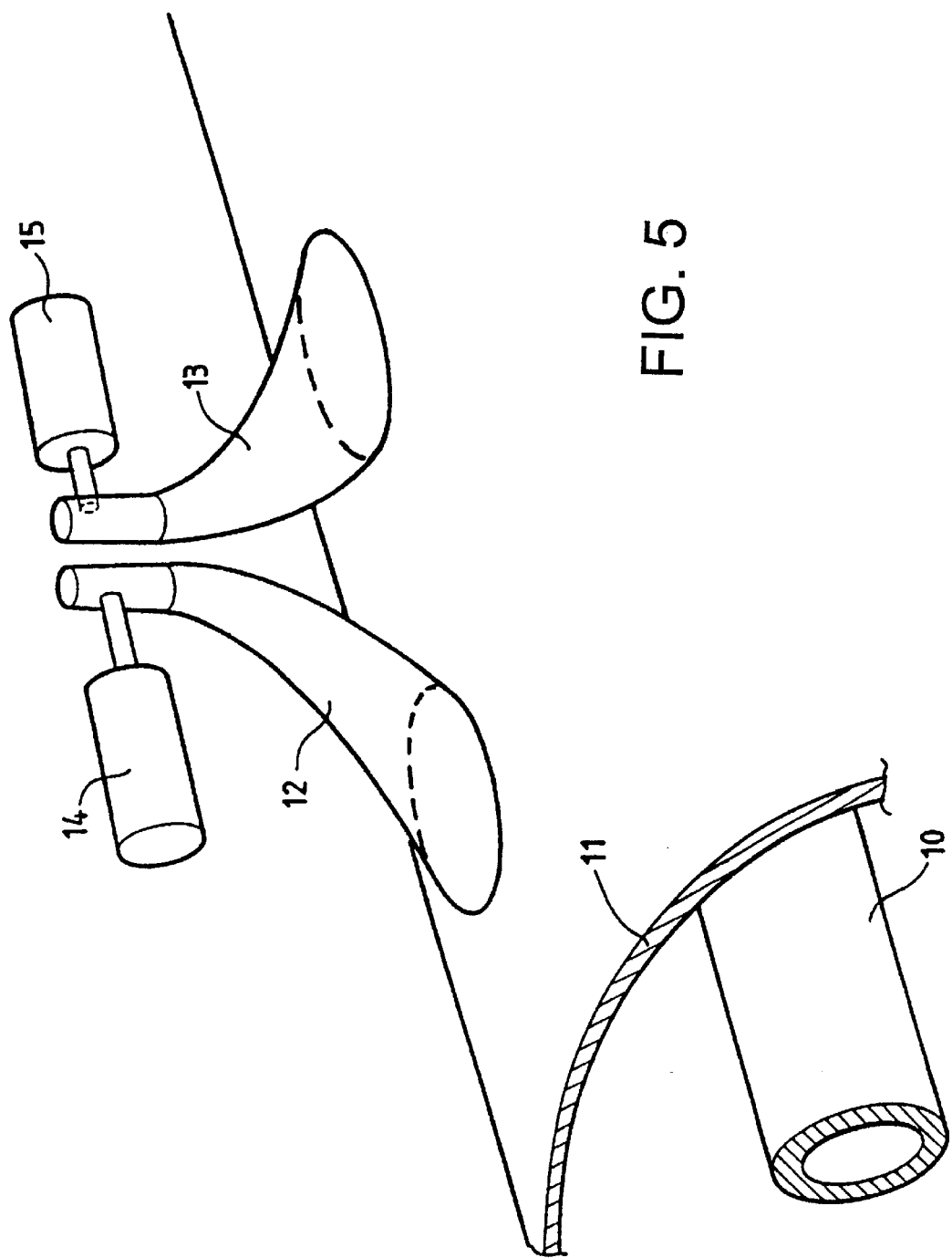
FIG. 5 shows an embodiment of such a both-way detection device.

FIG. 1 shows a hydraulic analogy of the phenomenon created by a short-circuit current in a metal-clad electrical link, such a link also being referred to as a "metal-clad cable", the segments of which link can be of considerable length, e.g. over 100 m long.

It should firstly be recalled that, over a short period of time, i.e. a few seconds in the present case, the pressure surge may be considered to be adiabatic since the heat exchange with the outside is negligible over said period. As a result, the heat energy contributed by the internal arc current generates an increase in the mean pressure inside the segment in question.

It is possible to make an analogy with a water channel 1 which, at some location along its bottom, is provided with a wide cylinder-and-piston system as shown in FIG. 1a. Raising the piston (FIG. 1b) causes an increase in the mean level of the water in the channel.

Clearly, if the channel is long, the increase in water level is negligible and difficult to detect. In analogous manner, it is difficult for an internal arc to be detected by means of the increase in the mean pressure in a long metal-clad cable.

On each side of the system 2, a wave 3 appears whose amplitude is a function of the characteristics (dimensions, piston speed) of the system 2. The wave propagates away from the location of the system 2 as shown in FIGS. 1c to 1e.

The amplitude of the variation in the water level at the wave is much greater than the variation in the mean water level, and it is therefore much easier to detect.

Considering a segment of metal-clad cable, by analogy, a pressure wave or surge is generated that is easier to detect than the variation in the mean pressure. This has been verified experimentally by the applicant.

That is why the invention proposes to detect the passage of the pressure surge, and, more particularly, to detect the rising edge of said surge as it goes past, which edge is relatively steep and thus generates a rapid variation. It is thus possible for the sensitivity with which internal arcs are detected to be increased considerably.

FIG. 2 shows the algorithm of a method of detecting said rising edge. With a pressure sensor connected to the cladding, the pressure of the dielectric gas in said cladding is measured continuously. FIGS. 2a and 2b show how the pressure P varies over time t at the sensor 4 due to the pressure surge going past.

This measurement is integrated continuously for two adjacent durations of 40 ms, namely from t-120 ms to t-80 ms, and from t-40 ms to t. Each of these two durations is equal to 40 ms and they are separated by a time interval that is also 40 ms in duration. This duration of 40 ms is substantially equal to one half of the time required for the rising edge 5 of the pressure surge 6 to go past the sensor. As shown in FIG. 2b, this makes it possible to measure and to compare the normal value of the pressure for the duration t-120 ms to t-80 me with a value in the vicinity of the peak pressure for the duration t-40 to t. The difference Δ between the two integrated values is calculated as follows.

$$\Delta = \int_{t-40}^{t} P dt - \int_{t-120}^{t-80} P dt$$

if this difference Δ, which is positive while the rising edge 5 of the pressure surge 6 is going past, is greater than a threshold value ΔP, which is shown in FIG. 2b and which is slightly less than the minimum possible value of the pressure surge generated by the internal arc, then it is concluded that an internal current fault has occurred in the metal-clad cable segment on which the pressure sensor is placed.

As shown in FIG. 3, according to another characteristic of the invention, for the purpose of further improving the sensitivity of the measurement, the sensor 4 is connected to the cladding via a duct 7 which, to return to the hydraulic analogy, is of shape and direction organized to form a "scoop" that receives the pressure surge.

The duct 7 is horn-shaped and constitutes a funnel. The mouth 8 of the duct 7 is connected to the cladding of the segment to be monitored, and its tip 9 is connected to the pressure sensor.

As shown in FIG. 3, the surge pressure difference shown in FIG. 3a is amplified by the duct 7 because of the pressure increase generated by the tapering of the section of the duct 7 (FIG. 3b). It is thus possible to determine a detection threshold AP which is approximately in the range 100 mb to 300 mb in the case of a metal-clad cable containing sulfur hexafluoride. This threshold value is determined as a function of the dielectric gas used and of its density inside the cladding.

FIG. 4 shows a set of two adjacent one-way-detection units, each of which is constituted by a duct 7, 7' connected to a sensor 4, 4'. The two ducts 7 and 7' slope in mutually opposite directions relative to the axis of the cladding 11, duct 7 sloping rightwards and duct 7' sloping leftwards, so that each of the sensors 4 and 4' is sensitive only to pressure surges coming from the direction opposite to its direction of slope, sensor 4 being sensitive to pressure surges coming from the left, and sensor 4' being sensitive to pressure surges coming from the right in FIG. 4. This configuration makes it possible to locate the fault relative to the one-way detection units.

In addition, if the instant at which the internal arc appears is known by means of grid protection apparatus, then the distance between the place at which the internal arc appears and the one-way detection unit can be determined merely by measuring time, the propagation speed of the pressure surge being known for the dielectric gas used. This makes it possible to locate the fault accurately.

Advantageously, the one-way detection units are disposed in the center of the segment to be monitored, thereby making it possible to limit the effect of the pressure surge being damped as it propagates and, therefore, to improve the sensitivity for a long-length segment to be monitored.

The two sensors are advantageously also constituted by the sensors used to perform leakage monitoring by measuring the density of the dielectric gas. The device shown in FIG. 4 therefore involves no significant extra cost.

FIG. 5 diagrammatically shows a set of two one-way detection units positioned on a metal-clad cable containing a central conductor 10 disposed in cladding 11 filled with a dielectric gas such an sulfur hexafluoride ($SF_6$) under pressure. The two ducts 12 and 13 open out into the cladding 11 and they are angularly positioned in opposite directions. Each of them is connected to a pressure sensor of known type 14, 15, such as those used to monitor the density of the dielectric gas.

For redundancy purposes, it is advantageous to duplicate the one-way detection units by using four units disposed at the same place, namely two left detection units and two right detection units. In this manner, it is possible to mitigate the consequences of any one unit failing, and in particular of a sensor failing, and to increase the reliability of the system. If the availability requirements are very high, it is possible to triplicate the one-way detection units.

Figure 6:
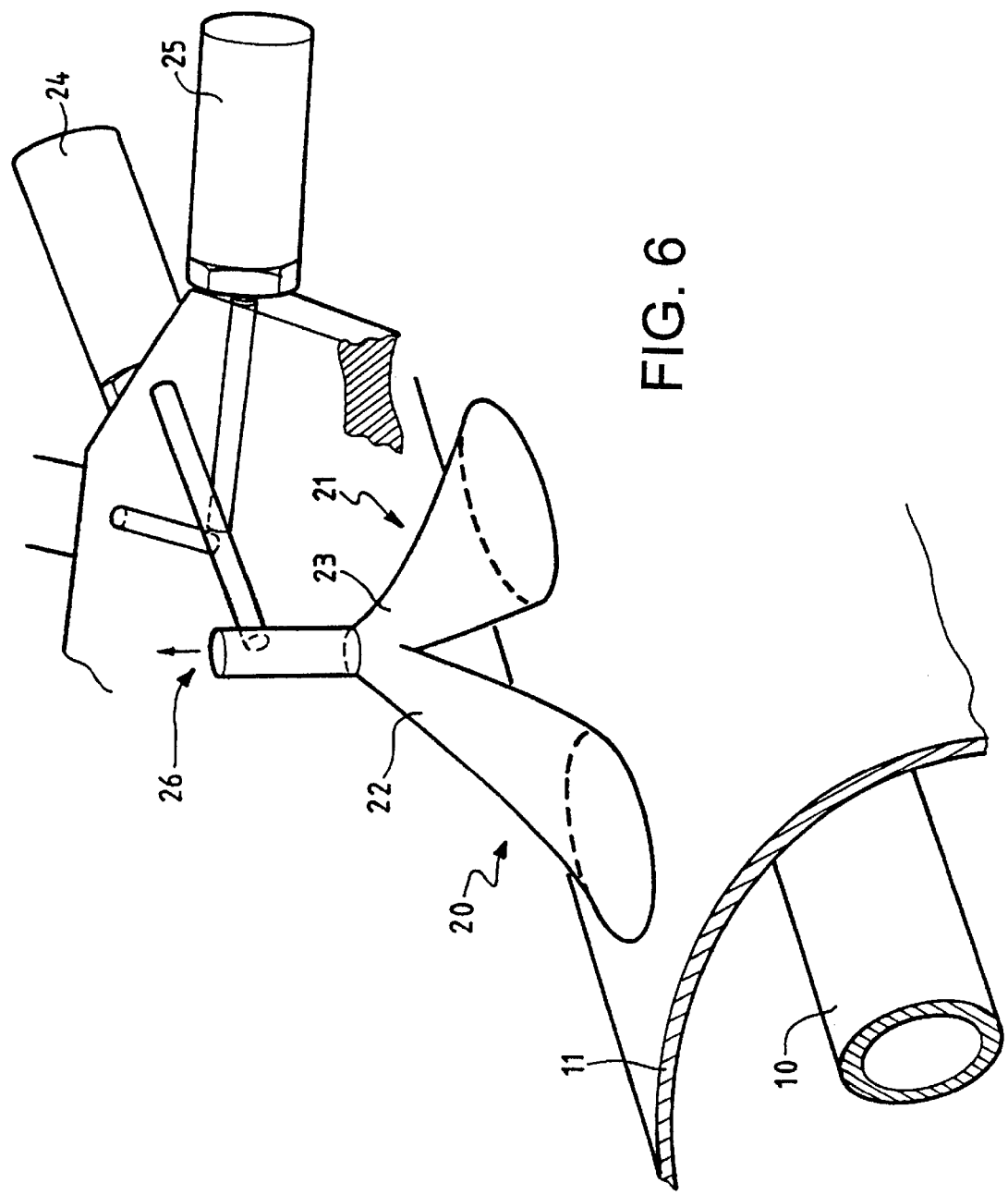
FIG. 6 shows an embodiment of a one-way detection device having two sensors.
Figure 7:
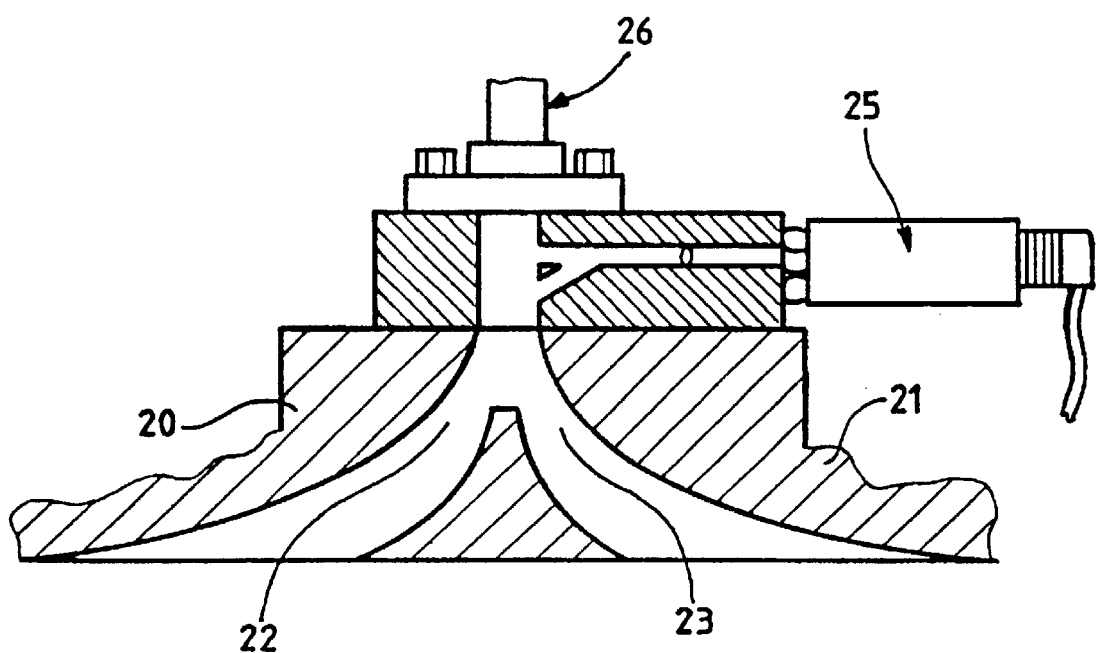
FIG. 7 is a section view of the device of FIG. 6.

FIGS. 6 and 7 show another embodiment of the invention, in which embodiment two opposite-direction ducts 20 and 21 are provided whose tips 22 and 23 are connected together and are connected to two sensors 24 and 25 disposed in parallel. As in the embodiment shown in FIG. 5, the two sensors are those already installed on the cladding 11 for the purpose of monitoring the density of the dielectric gas, and, at 26, a filler valve can be seen that makes it possible to compensate for any density losses that are detected.

The above description is given merely by way of non-limiting example, and, naturally, it is possible to make modifications thereto or to provide variants thereof without going beyond the ambit of the invention as defined in the claims. In particular, the value of the duration for which the pressure is measured is a function of the propagation speed of pressure surges in the dielectric gas; thus, in the case of an $SF_6$-nitrogen mixture, said duration is shorter because the propagation speed is higher than in $SF_6$.

What is claimed is:

1. A device for detecting an internal arc in a metal-clad electrical link, the device comprising at least a first one-way detection unit for detecting a rising edge of an internal pressure surge generated by the internal arc and propagating inside a cladding of the electrical link, the one-way detection unit including a pressure sensor disposed outside the cladding and a tapered horn-shaped duct connected to the inside of the cladding and sloping in a direction relative to a longitudinal axis of the cladding, the horn-shaped duct having a mouth opening in the cladding, and a tip connected to the pressure sensor, wherein the one-way detection unit detects the rising edge of the internal pressure surge propagating only in the direction of sloping of the horn-shaped duct.

2. A device according to claim 1, further comprising a second one-way detection unit including a pressure sensor and a tapered horn-shaped duct, wherein the first and second one-way detection units have the same detection direction, the second one-way detection unit is disposed in the vicinity of the first one-way detection unit, and the ducts of the first and second one-way detection units slope in the same direction.

3. A device according to claim 1, further comprising a second one-way detection unit including a pressure sensor and a tapered horn-shaped duct, wherein the first and second one-way detection units have opposite detection directions, the second one-way detection unit is disposed in the vicinity of the first one-way detection unit, and the ducts of the first and second one-way detection units slope in mutually opposite directions.

* * * * *